United States Patent
Takeshita et al.

(10) Patent No.: US 8,232,830 B2
(45) Date of Patent: Jul. 31, 2012

(54) RECTIFIER WITH LESS CONDUCTION LOSS THAN A DIODE

(75) Inventors: Miyuki Takeshita, Chiyoda-ku (JP); Akihiko Iwata, Chiyoda-ku (JP); Ikuro Suga, Chiyoda-ku (JP); Shigeki Harada, Chiyoda-ku (JP); Kenichi Kawabata, Chiyoda-ku (JP); Takashi Kumagai, Chiyoda-ku (JP); Kenji Fujiwara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 59 days.

(21) Appl. No.: 12/519,802

(22) PCT Filed: Dec. 20, 2007

(86) PCT No.: PCT/JP2007/001437
§ 371 (c)(1),
(2), (4) Date: Jun. 18, 2009

(87) PCT Pub. No.: WO2008/096393
PCT Pub. Date: Aug. 14, 2008

(65) Prior Publication Data
US 2010/0073082 A1 Mar. 25, 2010

(30) Foreign Application Priority Data

Feb. 2, 2007 (JP) ................................ 2007-023846
Feb. 2, 2007 (JP) ................................ 2007-023849

(51) Int. Cl.
*H03K 5/08* (2006.01)
(52) U.S. Cl. ......................... 327/330; 327/390; 327/589
(58) Field of Classification Search .................. 327/330, 327/390, 428, 589
See application file for complete search history.

(56) References Cited

U.S. PATENT DOCUMENTS

| 5,506,527 | A | 4/1996 | Rudolph et al. | |
|---|---|---|---|---|
| 5,627,460 | A * | 5/1997 | Bazinet et al. | 323/288 |
| 6,469,564 | B1 | 10/2002 | Jansen | |
| 6,747,441 | B2 * | 6/2004 | Johnson et al. | 323/282 |
| 7,199,561 | B2 * | 4/2007 | Noma | 323/224 |
| 7,259,613 | B2 * | 8/2007 | Meek et al. | 327/536 |
| 2002/0141214 | A1 | 10/2002 | Grover | |
| 2005/0218964 | A1 | 10/2005 | Oswald et al. | |

FOREIGN PATENT DOCUMENTS

| JP | 7 297699 | 11/1995 |
|---|---|---|
| JP | 11 146640 | 5/1999 |
| JP | 2003 533118 | 11/2003 |
| JP | 2004 519991 | 7/2004 |
| JP | 2005 295794 | 10/2005 |

* cited by examiner

*Primary Examiner* — Kenneth B. Wells
(74) *Attorney, Agent, or Firm* — Oblon, Spivak, McClelland, Maier & Neustadt, L.L.P.

(57) ABSTRACT

A highly efficient rectifier can readily replace a two-terminal diode. Its conduction losses are reduced from that of the two-terminal diode. Connected between the source and drain of a MOSFET including a parasitic diode are a micro-power converter section for boosting a conduction voltage Vds between the source and drain to a predetermined voltage, and a self-drive control section that operates based on a voltage output from the micro-power converter section. When the source and drain are conductive with each other, the micro-power converter section generates, from the conduction voltage Vds, a power source voltage for the self-drive control section, and the self-drive control section (4) continues drive control of the MOSFET.

12 Claims, 9 Drawing Sheets

[FIG. 1]
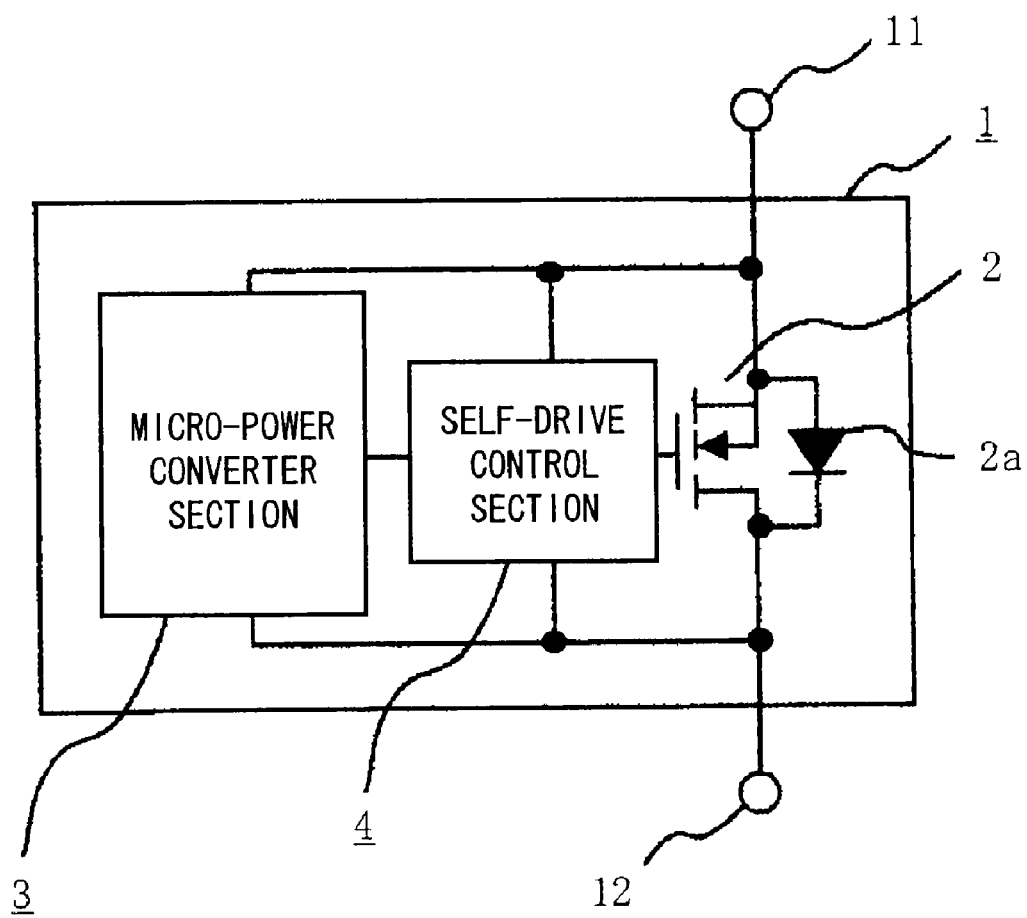

[FIG. 2]
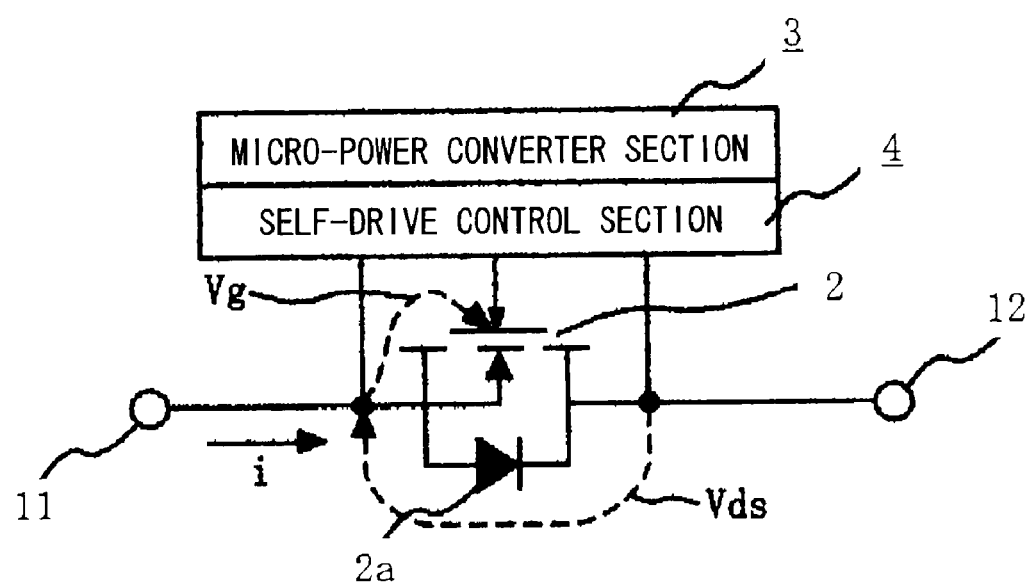

[FIG. 3]
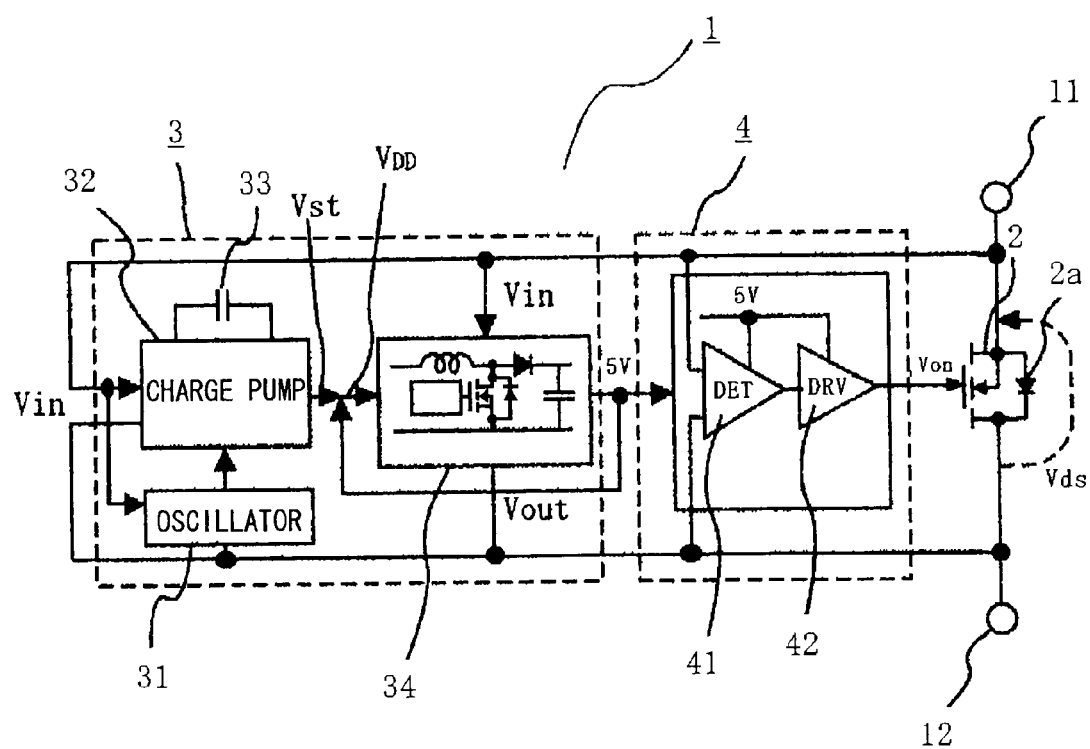

[FIG. 4]
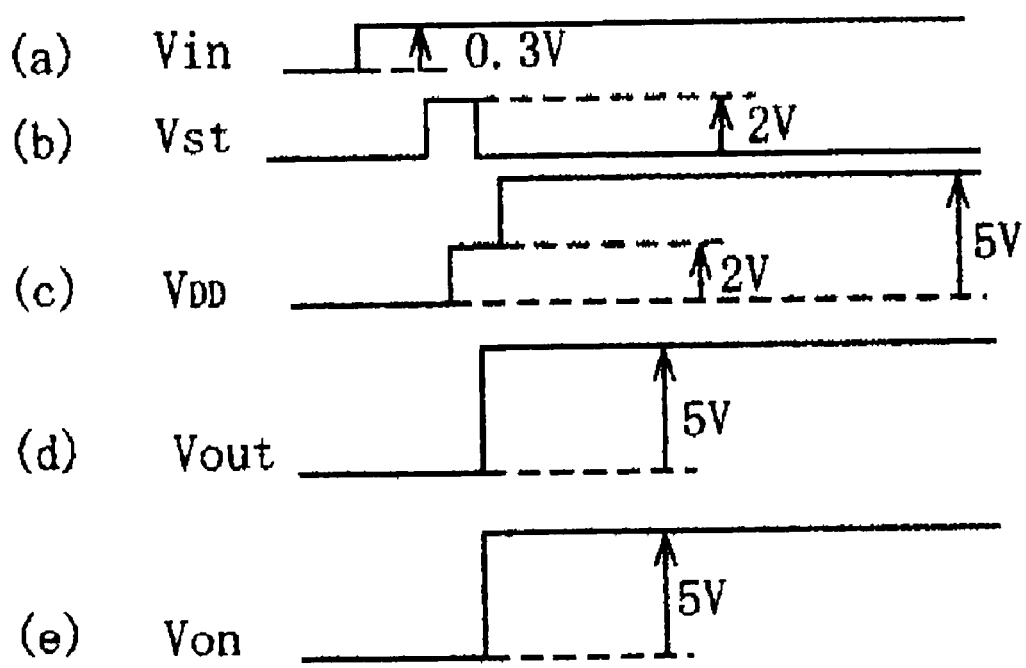

【FIG. 5】
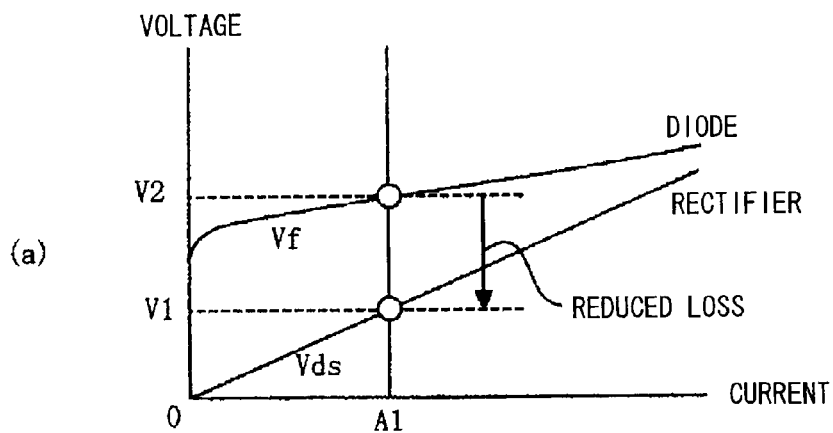
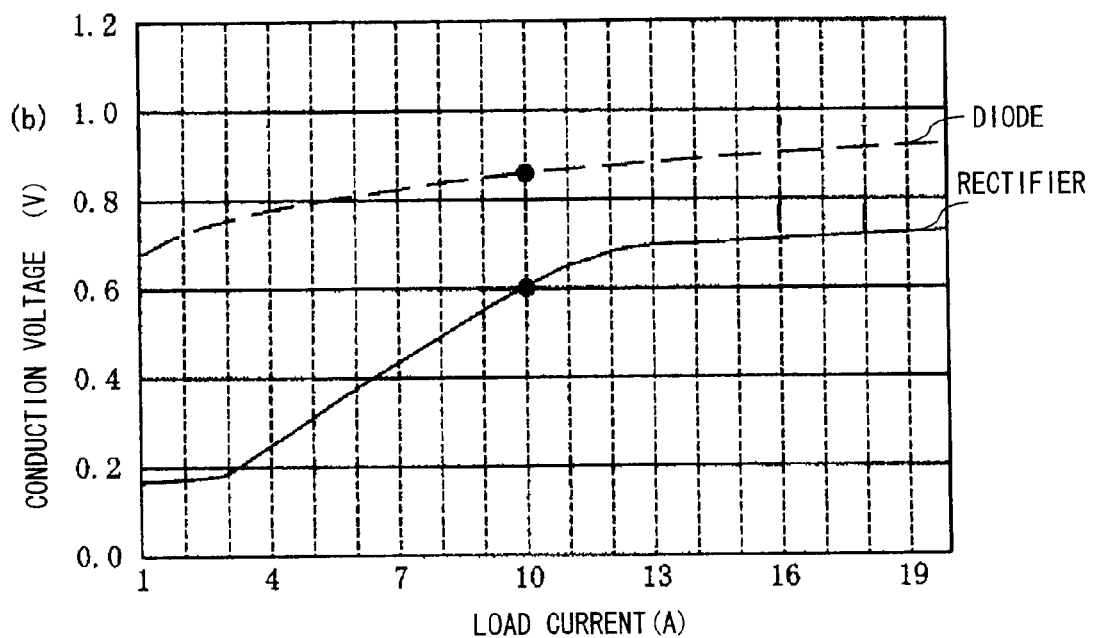

[FIG. 6]
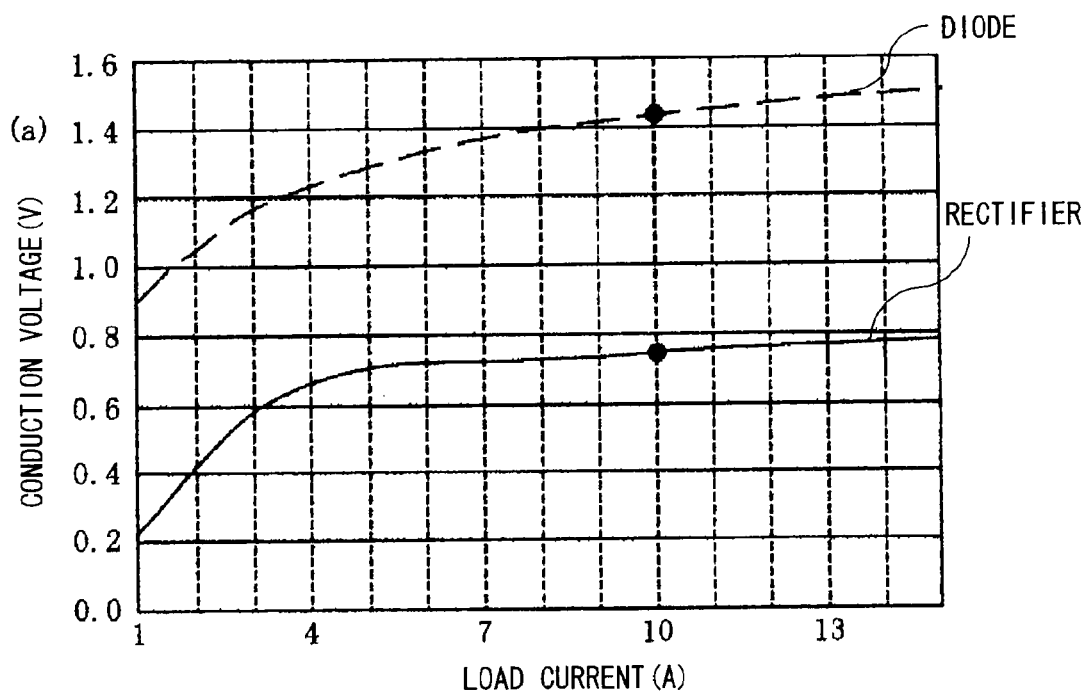
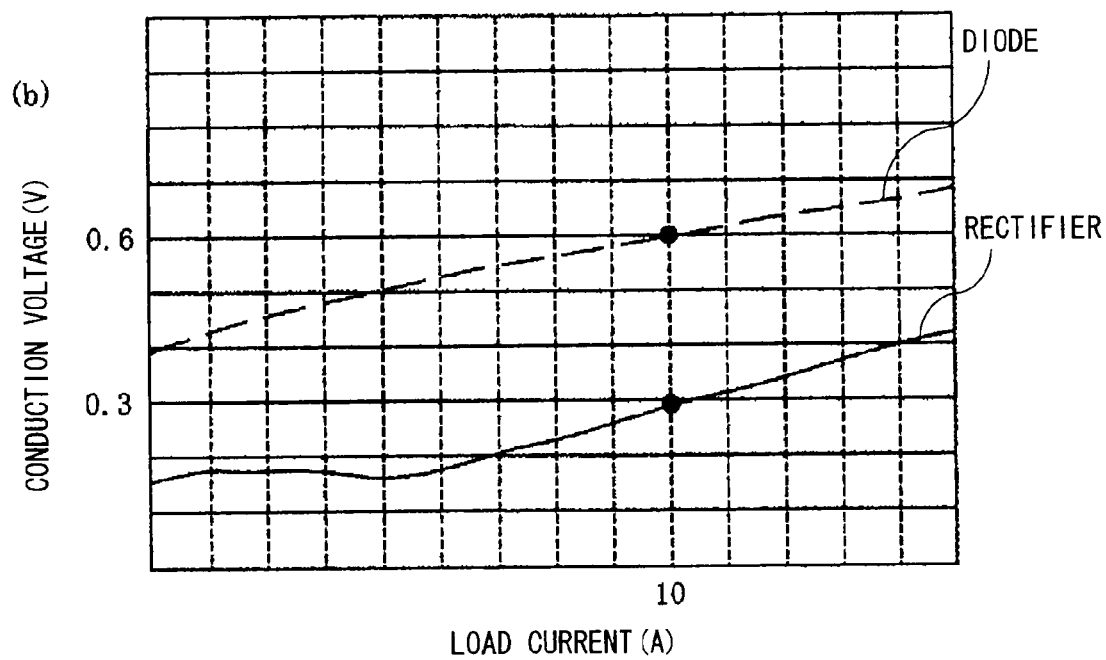

[FIG. 7]
(a)
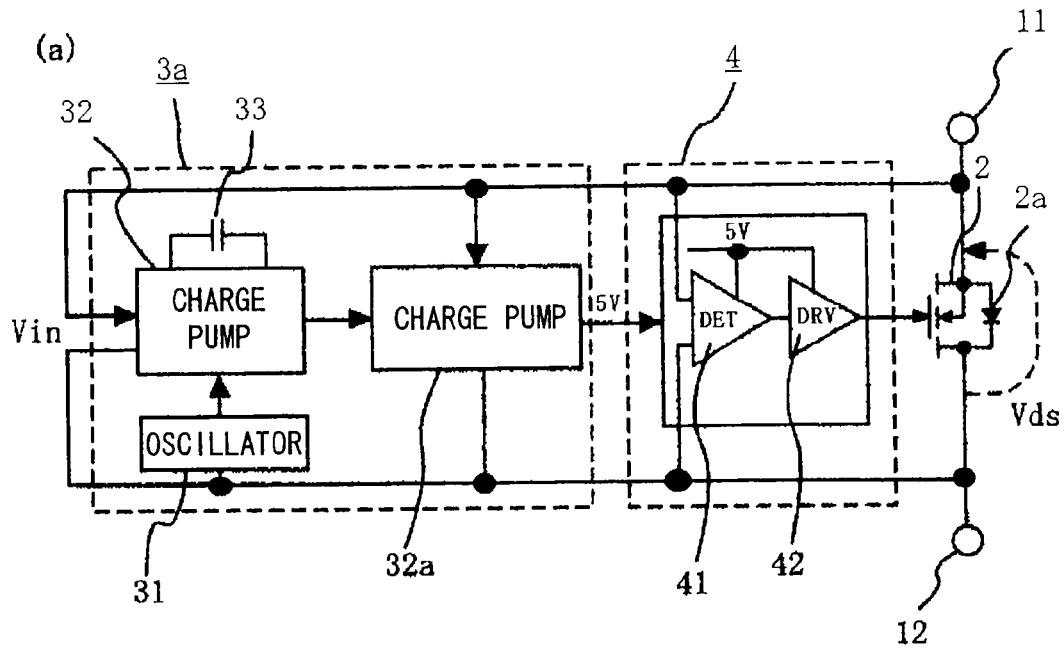
(b)
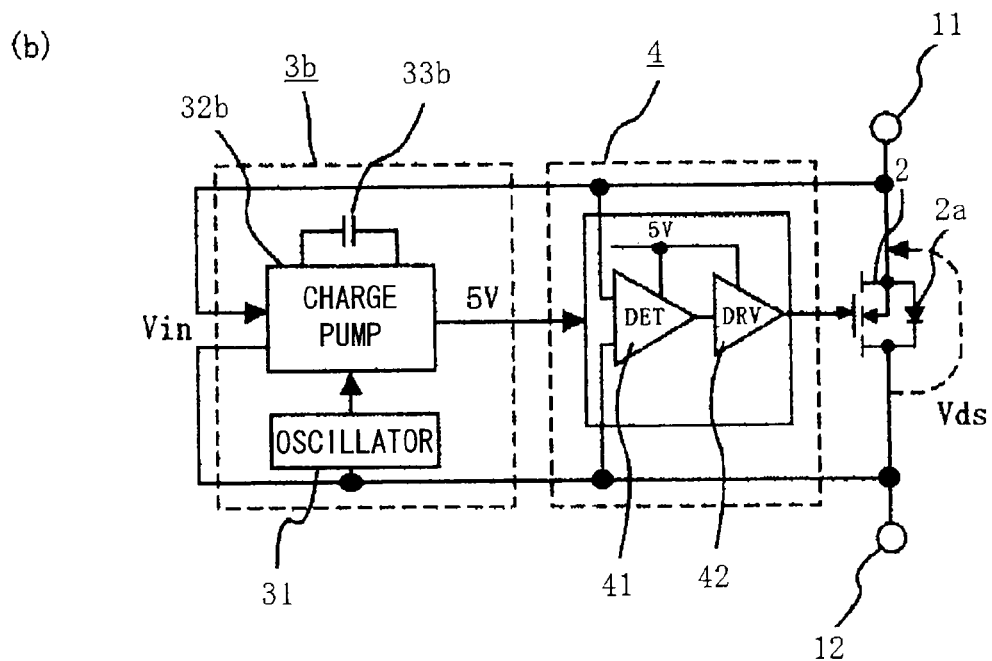

[FIG. 8]
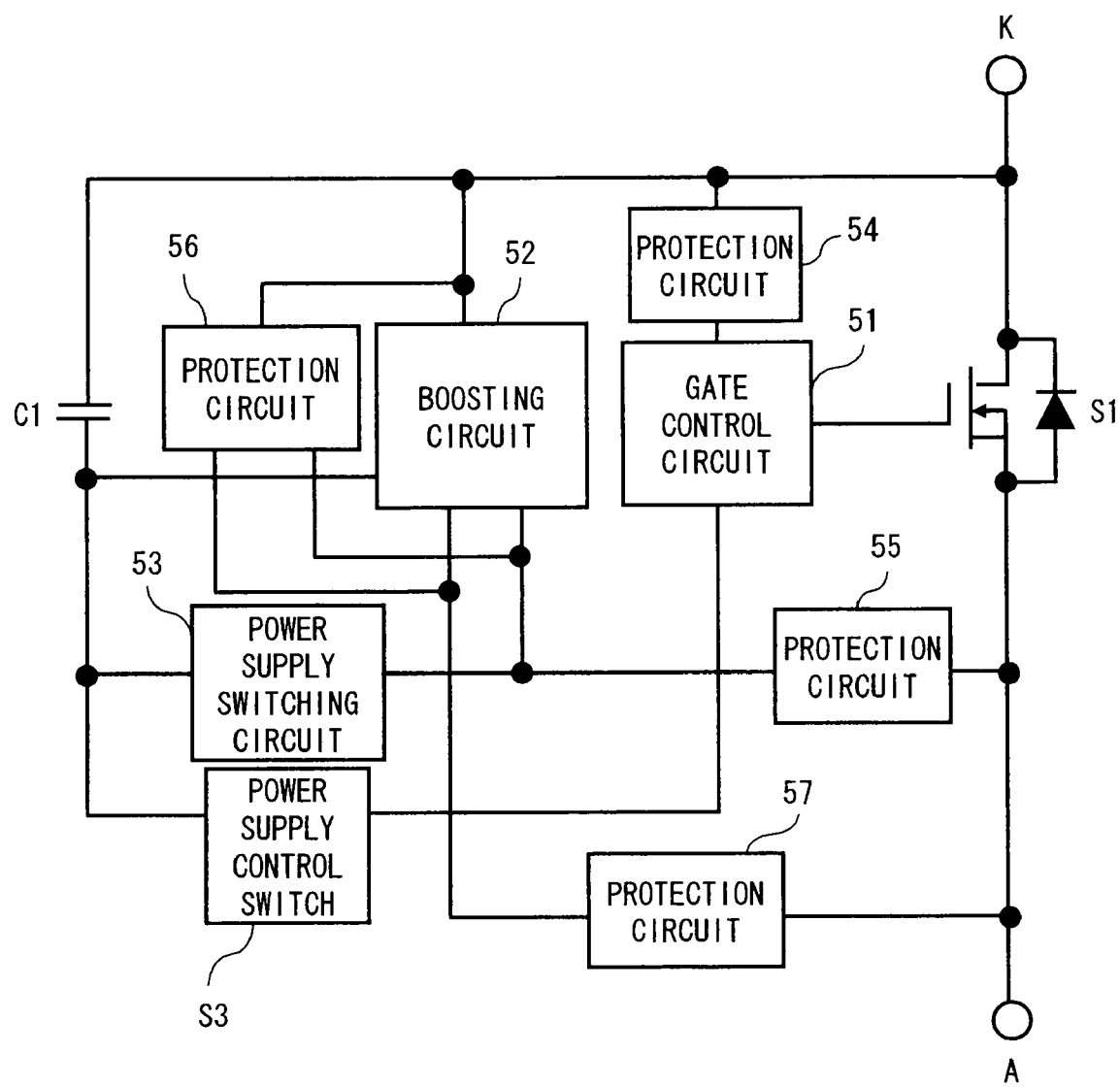

[FIG. 9]
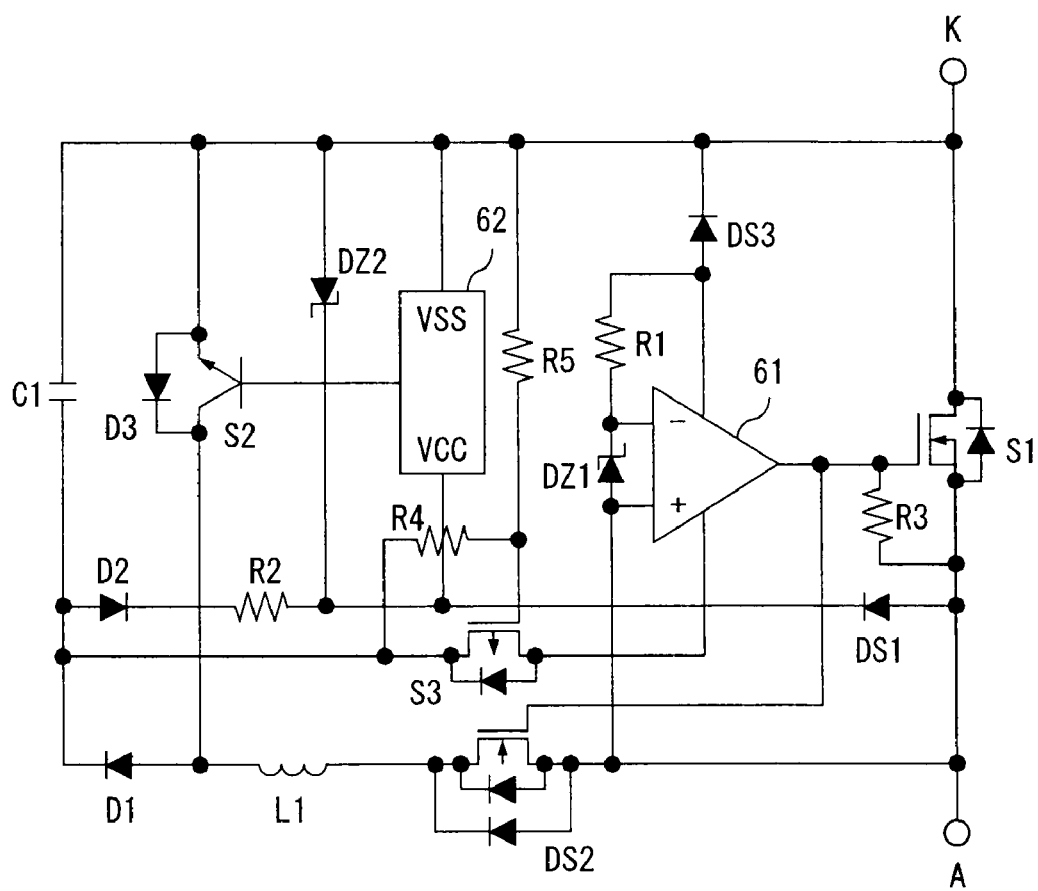

RECTIFIER WITH LESS CONDUCTION LOSS THAN A DIODE

TECHNICAL FIELD

The present invention relates to a rectifier connected between two external terminals, which allows a current to flow in only one direction and which blocks a current in a reverse direction.

BACKGROUND ART

A diode, which is a rectifying device connected between two external terminals, operates such that when a voltage is applied in a forward direction, the diode allows a current to flow in one direction from the anode side to the cathode side, and when a reverse voltage is applied, the diode blocks a current in a reverse direction from flowing. Such a general diode is used for a redundant power supply, rectifier or the like. However, in such a diode, a forward voltage occurs during conduction, and a relatively large conduction loss occurs in accordance with a product of this voltage and a forward current. In particular, in the case where a plurality of serially connected diodes are used in a redundant system or the like, there is a problem that the loss increases by the number of connected diodes.

A low power consumption diode circuit, which is a conventional rectifier with low conduction loss, has an anode wire and a cathode wire, and includes a comparator, a switch and a diode. The comparator has two inputs, and the anode wire is connected to one of the inputs, and the cathode wire is connected to the other input. When a voltage of the anode wire is greater than a voltage of the cathode wire by more than a predetermined forward voltage, the comparator outputs a high logic level signal to an output line, and the switch switches so as to allow conduction, whereby the anode wire and the cathode wire are electronically connected (e.g., Patent Document 1).

A two-terminal synchronous rectifier, which is another example of a conventional rectifier with low conduction loss, includes: a field-effect transistor having its source-drain path in a first arm between the two rectifier terminals; a gate-control circuit, connected to the gate electrode of the transistor, for turning on/off the transistor synchronously in accordance with voltage reversal at the two rectifier terminals; and further, a parallel arm including a charge pump formed thereon, which charge pump is driven by a voltage difference between the two rectifier terminals so as to drive the gate-control circuit. Also, a pn diode is intrinsically formed within the transistor (see, e.g., Patent Document 2).

[Patent Document 1] Japanese Laid-Open Patent Publication No. H07-297699

[Patent Document 2] Japanese National Phase PCT Laid-Open Publication No. 2004-519991

DISCLOSURE OF THE INVENTION

Problems to be Solved by the Invention

The conventional rectifier described in the above Patent Document 1 uses an N-MOSFET as a switch, for example. Accordingly, the conventional rectifier can reduce conduction loss as compared to a diode. However, the conventional rectifier requires drive voltage, which causes the switch to operate, to be supplied from outside. Therefore, it is necessary to have a power source terminal in addition to the two terminals at the anode wire side and the cathode wire side. For this reason, there is a difficulty replacing a general two-terminal diode with the conventional rectifier.

The conventional rectifier described in the above Patent Document 2 includes a charge pump that generates, based on a voltage difference between the two rectifier terminals, a drive voltage for the gate-control circuit. However, when the transistor is turned on, a capacitor of the charge pump is not charged. As a result, the drive voltage for the gate control circuit cannot be retained, and the transistor is turned off. Thus, there is a difficulty keeping the transistor turned on.

The present invention solves the above problems. The object of the present invention is to enable a rectifier, in which a switching device with reduced conduction loss is connected between two external terminals, to: eliminate the necessity of having an additional terminal and an external power source; readily replace a two-terminal diode; and continuously generate drive voltage when the switching device is ON, thereby allowing the switching device to continuously perform an ON operation.

Solution to the Problems

A rectifier of the present invention is a rectifier, external terminals of which are two terminals that are an anode terminal and a cathode terminal. The rectifier includes: a semiconductor switching device connected between the two terminals, which is drive-controlled via a gate electrode thereof; a parallel diode, connected in parallel to the semiconductor switching device, for performing a rectifying operation when the rectifier starts operating; and drive signal generating means for outputting a drive signal to the gate electrode of the semiconductor switching device, the drive signal generating means using, as a power source, a forward voltage that occurs between the two terminals when the two terminals are conductive with each other.

Effect of the Invention

The rectifier of the present invention includes a drive signal generating means for outputting a drive signal to the gate electrode of the semiconductor switching device, the drive signal generating means using, as a power source, a forward voltage that occurs between the two terminals when the two terminals are conductive with each other. For this reason, the rectifier does not require an additional terminal and an external power source, and can readily replace a two-terminal diode. Also, the rectifier is capable of continuously generating drive voltage when the semiconductor switching device is ON, thereby allowing the semiconductor switching device to continuously perform an ON operation.

BRIEF DESCRIPTION OF THE DRAWINGS

FIG. 1 shows a brief configuration of a rectifier according to the first embodiment of the present invention.

FIG. 2 shows an operation principle of the rectifier according to the first embodiment of the present invention.

FIG. 3 illustrates an internal configuration of the rectifier according to the first embodiment of the present invention.

FIG. 4 shows voltage waveforms at respective components of the rectifier according to the first embodiment of the present invention, for the description of operations of the rectifier.

FIG. 5 shows conduction voltage of a rectifier according to the second embodiment of the present invention.

FIG. 6 shows another example of conduction voltage of the rectifier according to the second embodiment of the present invention.

FIG. 7 illustrates an internal configuration of a rectifier according to the third embodiment of the present invention.

FIG. 8 shows a brief configuration of a rectifier according to the fourth embodiment of the present invention.

FIG. 9 shows a circuit configuration of a rectifier according to the fifth embodiment of the present invention.

BEST MODE FOR CARRYING OUT THE INVENTION

First Embodiment

Hereinafter, a rectifier according to the first embodiment of the present invention will be described with reference to the drawings. FIG. 1 shows a schematic structure of the rectifier according to the first embodiment of the present invention.

As shown in the diagram, the rectifier 1 includes: as a semiconductor switching device, a power MOSFET 2 that includes, between the source and drain thereof, a parasitic diode 2a that is a parallel diode (hereinafter, simply referred to as a MOSFET 2); a micro-power converter section 3 that is a boosting circuit; and a self-drive control section 4 that is a drive control circuit. External terminals of the rectifier 1 are two terminals that are an anode terminal 11 and a cathode terminal 12. In this case, the MOSFET 2 is an n-channel MOSFET whose source electrode is connected to the anode terminal 11 and whose drain electrode is connected to the cathode terminal 12.

Further, here, the micro-power converter section 3 and the self-drive control section 4 constitute drive signal generating means as claimed in claim 1 of the present invention.

FIG. 2 shows an operation principle of the rectifier 1 shown in FIG. 1. Note that, in the description below, components denoted by the same reference numeral have the same function.

As shown in FIG. 2, the micro-power converter section 3 and the self-drive control section 4 are each connected between the source and drain of the MOSFET 2. Prior to the start of operation of the rectifier 1, the micro-power converter section 3 and the self-drive control section 4 are both in a halt condition, and the MOSFET 2 is nonconductive, that is, in an open state. When, in this state, a forward voltage is applied to the rectifier 1 and a current i flows from the anode terminal 11 to the cathode terminal 12, a forward current flows through the parasitic diode 2a. As a result, the rectifier 1 starts operating, and a potential difference of a few hundreds of mV, which is a voltage between both ends of the parasitic diode 2a, occurs between the source and drain of the MOSFET 2 due to a forward voltage characteristic of the parasitic diode 2a. A minute voltage due to the potential difference causes the micro-power converter section 3 to start operating, and the micro-power converter section 3 starts a boosting operation.

The micro-power converter section 3 boosts a voltage Vds between the source and drain to a predetermined voltage, which voltage Vds occurs between the anode terminal 11 and the cathode terminal 12 during conduction when the current i flows from the anode terminal 11 to the cathode terminal 12. The voltage generated by this boosting operation is supplied to the self-drive control section 4 as a power source voltage, and the self-drive control section 4 generates a gate drive signal (drive voltage Vg) for the MOSFET 2. When, as a result, the MOSFET 2 is turned on and becomes conductive, the current i flows from the anode terminal 11 to the cathode terminal 12 through the MOSFET 2. The current i flowing through the MOSFET 2 at this point is not a current that flows through the parasitic diode 2a, but a genuine switch current that flows through a channel when the MOSFET 2 is turned on.

When the current i flows through the MOSFET 2, a voltage drop occurs due to the current i and an internal resistance of the MOSFET 2, and the voltage Vds of, for example, 0.3V occurs between the source and drain of the MOSFET 2. The voltage between the source and drain is supplied to the micro-power converter section 3, and the micro-power converter section 3 performs an operation to boost the voltage. The boosted voltage is supplied to the self-drive control section 4 as a power source voltage. Then, the self-drive control section 4 generates the gate drive signal for the MOSFET 2. As a result, the MOSFET 2 becomes conductive.

By repeating the above operations, the conduction voltage Vds, which occurs between the source and drain when the MOSFET 2 is conductive, is boosted and the boosted voltage is fed to the self-drive control section 4, whereby the MOSFET 2 is driven continuously.

As for the rectifier 1 shown in FIGS. 1 and 2, internal configurations of the micro-power converter section 3 and the self-drive control section 4 are shown in FIG. 3.

As shown in FIG. 3, the micro-power converter section 3 and the self-drive control section 4 are each connected between the source and drain of the MOSFET 2. The micro-power converter section 3 includes: as a preceding-stage boosting section, a boosting circuit that is formed with an oscillator 31 and a charge pump 32, the oscillator 31 acting as a clock generation circuit; and as a subsequent-stage boosting section, a DC/DC converter 34 that is provided at a subsequent stage to the charge pump 32. Note that, denoted by 33 is a charge-discharge capacitor included in the charge pump 32.

Note that, the charge pump is a switched capacitor that is a combination of a plurality of capacitors and switches. The charge pump is able to start operating with a very small voltage as compared to other boosting means.

Further, the DC/DC converter 34 is configured as, e.g., a boosting chopper circuit that is formed with a reactor, a diode and a switch.

The self-drive control section 4 includes a terminal-to-terminal voltage detection section 41 and a gate driver 42. The self-drive control section 4 operates by using, as a power source, a voltage supplied from the micro-power converter section 3. The output of the gate driver 42 is connected to the gate electrode of the MOSFET 2. The terminal-to-terminal voltage detection section 41 and the gate driver 42 are each configured as a low-power-consumption current circuit.

FIG. 4 shows voltage waveforms at respective components of the rectifier 1, for the description of operations of the rectifier 1. FIG. 4(a) is a waveform of a voltage Vin inputted to the micro-power converter section 3 and the self-drive control section 4. In this case, the conduction voltage Vds, which occurs between the source and drain of the MOSFET 2, is the voltage Vin. FIG. 4(b) shows a waveform of a voltage Vst generated by the charge pump 32. FIG. 4(c) shows a waveform of a power source voltage VDD for the DC/DC converter 34. FIG. 4(d) shows a waveform of an output voltage Vout of the DC/DC converter 34. FIG. 4(e) shows a waveform of an output voltage (a gate drive signal) Von of the gate driver 42.

Hereinafter, operations of the rectifier 1 will be described in detail with reference to FIGS. 3 and 4.

The conduction voltage occurring between the source and drain of the MOSFET 2, e.g., a voltage of approximately 0.3V, is inputted to the micro-power converter section 3 and the self-drive control section 4 as the input voltage Vin. The input voltage Vin is a forward voltage that occurs between both ends of the parasitic diode 2a when the rectifier 1 starts operating. In practice, the input voltage Vin is slightly higher than the conduction voltage that occurs when the MOSFET 2 is ON.

In the micro-power converter section 3, at the start of its operation at which the parasitic diode 2a becomes conductive, the boosting circuit formed with the oscillator 31 and the charge pump 32 is activated by the input voltage Vin, and the input voltage Vin is boosted so as to output the voltage Vst of, for example, 2V. The DC/DC converter 34 at the subsequent stage is activated by using, as the power source voltage VDD, the voltage Vst boosted by the charge pump 32. The input voltage Vin is also inputted to the DC/DC converter 34. The DC/DC converter 34 boosts the input voltage Vin to a predetermined voltage of, for example, 5V, and outputs the voltage as the voltage Vout.

The output voltage Vout of the DC/DC converter 34 is supplied to the self-drive control section 4 as a power source voltage, and at the same time, supplied to the DC/DC converter 34 for the power source voltage VDD. Accordingly, the power source voltage VDD is increased to a higher voltage level, for example, from 2V to 5V.

As described above, the DC/DC converter 34 is configured such that the output voltage Vout is supplied as a power source voltage for the DC/DC converter 34. Accordingly, after the DC/DC converter 34 is activated by the voltage Vst boosted by the charge pump 32, boosting operations can be repeated continuously.

The self-drive control section 4 operates using, as a power source voltage, the output voltage Vout of the DC/DC converter 34, which is an output from the micro-power converter section 3. The input voltage Vin is inputted to the terminal-to-terminal voltage detection section 41 of the self-drive control section 4. When detecting conduction between the source and drain of the MOSFET 2, the terminal-to-terminal voltage detection section 41 outputs a signal to the gate driver 42, and in response to the signal outputted from the terminal-to-terminal voltage detection section 41, the gate driver 42 outputs the gate drive signal Von.

Note that, also in the case where the source and drain of the MOSFET 2 have become conductive with each other via the parasitic diode 2a, the terminal-to-terminal voltage detection section 41 detects the conduction between the source and drain, similarly to the case where the source and drain become conductive with each other when the MOSFET 2 is turned on.

As described above, when the source and drain of the MOSFET 2 have become conductive with each other, the self-drive control section 4 outputs the gate drive signal Von that turns on the MOSFET 2, in order to maintain the conduction between the source and drain. Also, the micro-power converter section 3 performs a boosting operation by using, as the input voltage Vin, the conduction voltage that occurs when the source and drain are conductive with each other. The DC/DC converter 34 outputs the output voltage Vout to the self-drive control section 4 as a power source voltage, and also to the DC/DC converter 34 as a power source voltage, whereby boosting operations are performed continuously.

As a result of repeating the above operations, the micro-power converter section 3 generates necessary voltage and the self-drive control section 4 drives the MOSFET 2, during a period when the conduction voltage is occurring between the source and drain of the MOSFET 2. This series of operations allows the rectifier 1 to maintain continuous conduction while performing self feeding.

Accordingly, it is not necessary to supply, from outside, a drive voltage of, for example, 5V for driving the gate electrode of the MOSFET 2, and the self-drive control section 4 is able to continuously drive the MOSFET 2. Thus, since power supply from outside is unnecessary, the rectifier 1 can readily replace a two-terminal diode. As compared to the diode, conduction loss of the rectifier 1 is reduced, and thus the rectifier 1 is more efficient.

Further, the micro-power converter section 3 has a two-stage configuration including: a boosting circuit mainly formed with the oscillator 31 and the charge pump 32; and a DC/DC converter 34 provided at a subsequent stage to the charge pump 32. The DC/DC converter 34 uses the output voltage Vout also for the power source voltage for the DC/DC converter 34. Accordingly, the DC/DC converter 34 is able to: generate necessary power source voltage for the DC/DC converter 34 by performing boosting operations; efficiently and stably perform continuous boosting operations; and supply the self-drive control section 4 with a power source voltage that is used as a drive voltage. Note that, the oscillator 31 and the charge pump 32 are each configured to operate with a minute conduction voltage of approximately 0.3V. For this reason, the minute conduction voltage can activate the boosting operation, and the DC/DC converter 34 can be activated by the voltage boosted by the charge pump 32.

Second Embodiment

The rectifier 1 according to the above first embodiment can readily replace a widely used conventional two-terminal diode. Hereinafter, conduction loss of the rectifier 1 will be described in comparison to conduction loss of a two-terminal diode.

A conduction loss Pon, which occurs when a current flows between the two terminals 11 and 12 of the rectifier 1, can be represented by a product of: the voltage Vds that occurs between the source and drain of the MOSFET 2; and a current id flowing between the source and drain. When the on-resistance of the MOSFET 2 is Rdson, the following equation is satisfied:

$$Vds = Rdson \cdot Id$$

$$\begin{aligned}Pon &= Vds \cdot Id \\ &= (Rdson \cdot Id) \cdot Id \\ &= Rdson \cdot Id^2\end{aligned}$$

It is understood from the above equation that when the same current id flows through the rectifier 1, the conduction loss Pon decreases in accordance with a decrease in the value of the on-resistance Rdson of the MOSFET 2. In general, there is a tendency for the on-resistance Rdson of the MOSFET 2 to decrease in accordance with a decrease in the withstand voltage of the MOSFET. The on-resistance Rdson ranges from a few tens of mΩ to approximately 2Ω.

Whereas in a conventional diode, when a current flows from the anode terminal to the cathode terminal, a forward voltage Vf, which is approximately 0.4 to 2V in general, occurs due to characteristics of the diode device. A conduction loss Pon-d when the forward current flows through the diode can be represented by a product of the forward voltage Vf and the forward current If. Accordingly, the following equation is realized:

$$Pon\text{-}d = Vf \cdot If$$

FIG. 5(a) shows a comparison between a voltage of the rectifier 1 during conduction and a voltage of a conventional diode during conduction. When the forward current Id of A1 (ampere) flows through the rectifier 1, a conduction voltage that occurs between the two terminals 11 and 12, i.e., the voltage Vds that occurs between the source and drain of the MOSFET 2, is V1. When the forward current If of the same A1 (ampere) flows through the diode, the forward voltage Vf is V2. Here, V2>V1. This shows that the conduction loss Pon of the rectifier 1 is reduced, by (V2−V1)·A1, from the conduction loss Pon-d of the diode.

For instance, the rectifier 1, which uses the MOSFET 2 having a withstand voltage of 300V-class, is compared below with a diode having the same withstand voltage of 300V-class. A relatively normal value of the on-resistance Rdson of the MOSFET 2 having the withstand voltage of 300V-class, is approximately 0.06 Ω. It is assumed here that the forward voltage of the diode is approximately 0.8V when the forward current of approximately 10 A flows through the diode. When the current of 10 A flows through the rectifier 1, the voltage Vds that occurs between the source and drain of the MOSFET 2 is approximately 0.6V, and this conduction voltage of the rectifier 1 is lower by 0.2V than the conduction voltage of approximately 0.8V of the diode. As a result, the conduction loss Pon (6W) of the rectifier 1 is reduced by 25% from the conduction loss Pon-d (8W) of the diode.

FIG. 5(b) shows measurement data that shows a comparison between the conduction voltage of the rectifier 1, which uses the MOSFET 2 having the withstand voltage of 300V-class, and the conduction voltage of a diode having a withstand voltage of 400V-class. This case also shows that the conduction voltage of the rectifier 1 is lower than that of the diode, and the conduction loss of the rectifier 1 is reduced from that of the diode.

It is understood that the present invention has a configuration in which the power for the micro-power converter section 3 and the self-drive control section 4 to drive the MOSFET 2 is supplied from both the terminals 11 and 12 of the main circuit. The conduction voltage of the MOSFET 2 as shown in FIG. 5 represents a voltage in such a manner as to include a loss that occurs in the above micro-power converter section 3 and in the self-drive control section 4. The following FIG. 6 shows comparison results in the same manner.

FIGS. 6(a) and 6(b) respectively show measurement data measured in cases where the conduction voltage of the rectifier 1 is approximately half of that of the diode. These cases both show that when an instance where the forward current of approximately 10 A flows through the rectifier 1 and an instance where the forward current of approximately 10 A flows through the diode are compared, the conduction voltage of the rectifier 1 is approximately half of that of the diode, and the conduction loss Pon of the rectifier 1 is reduced, approximately by half, from the conduction loss Pon-d of the diode.

As described above, since the conduction voltage Vds that occurs between the source and drain of the MOSFET 2 is a product of the current Id and the on-resistance Rdson, the conduction voltage Vds can be reduced in accordance with a decrease in the on-resistance Rdson, and also, the conduction loss can be reduced. In particular, when it is assumed that the rectifier 1 is applied for a large-current range, the MOSFET 2 whose on-resistance Rdson is sufficiently small is to be used.

Third Embodiment

The above first embodiment describes that the DC/DC converter 34 is included in the micro-power converter section 3. Hereinafter, in the present embodiment, a rectifier, in which the micro-power converter section having a different configuration is used, will be described with reference to FIG. 7. Note that, components other than the micro-power converter section and operations performed by these components are the same as those described in the above first embodiment.

In the present embodiment, as shown in FIG. 7(a), a micro-power converter section 3a includes the same boosting circuit as that described in the above first embodiment, which is formed with the oscillator 31 and the charge pump 32. Further, another charge pump 32a is provided at a subsequent stage to the charge pump 32.

At the start of operation of the micro-power converter section 3a, at which the parasitic diode 2a becomes conductive, the boosting circuit formed with the oscillator 31 and the charge pump 32 is activated by the input voltage Vin, and the input voltage Vin is boosted to output the voltage Vst of, for example, 2V. The charge pump 32a provided at the subsequent stage performs a boosting operation on the voltage Vst boosted by the charge pump 32, and outputs a predetermined voltage, for example, the voltage Vout of 5V, to the self-drive control section 4. Then, the self-drive control section 4 drives the MOSFET 2. As a result, a conduction voltage occurs between the source and drain of the MOSFET 2. This conduction voltage is inputted as the input voltage Vin to the micro-power converter section 3a and the self-drive control section 4, whereby the operations continue.

Although in this case the two-stage charge pumps 32 and 32a are described, multi-stage charge pumps, e.g., charge pumps provided at three stages or more, maybe alternatively provided. By having the multi-stage charge pumps 32 and 32a in this manner, the output voltage Vout of, for example, 5V can be generated from a minute conduction voltage between the source and drain, and the generated output voltage Vout can be outputted to the self-drive control section 4 as a power source voltage.

As a result of repeating the above operations, the micro-power converter section 3a generates necessary voltage and the self-drive control section 4 drives the MOSFET 2, during a period when the conductive voltage is occurring between the source and drain of the MOSFET 2. This series of operations allows the rectifier to maintain continuous conduction while performing self feeding.

Accordingly, similarly to the above first embodiment, it is not necessary to supply, from outside, a drive voltage for driving the gate electrode of the MOSFET 2, and therefore the rectifier can readily replace a two-terminal diode. As compared to the diode, conduction loss of the rectifier is reduced, and thus the rectifier is more efficient.

Although the above embodiment describes that the plurality of charge pumps 32 and 32a are provided, a micro-power converter section 3b, which includes the oscillator 31 and a single charge pump 32b, may be formed as shown in 7(b). Here, denoted by 33b is a charge-discharge capacitor included in the charge pump 32b. In this case, the charge pump 32b has to be a high-performance charge pump that is able to generate the output voltage Vout of, for example, 5V from a minute conduction voltage between the source and drain.

Although not shown, depending on: the magnitude of the conduction voltage of the parasitic diode 2a or the MOSFET 2; the magnitude of a gate voltage necessary for driving the MOSFET 2; or the like, the MOSFET 2 can be turned on based on the conduction voltage without using the boosting circuit. Also in this case, the effect, in which the rectifier can maintain the continuous conduction while performing self feeding, is provided.

Further, in the above first to third embodiments, the n-channel power MOSFET 2 including the parasitic diode 2a is used in the rectifier as a semiconductor switching device. However, a p-channel power MOSFET may be used instead. Further, other semiconductor switching device such as a SiC transistor that is drive-controlled via the gate electrode may be used instead. In the case of using a semiconductor switching device that does not include the parasitic diode 2a, the same operation can be performed and the same effect can be obtained by connecting, along a forward direction, a parallel diode to the semiconductor switching device.

Fourth Embodiment

FIG. 8 is a block diagram showing a brief configuration of a rectifier according to the fourth embodiment of the present invention. Here, the rectifier includes reverse voltage protection circuits that protect, when a reverse voltage is applied between two terminals, i.e., A and K terminals, of the rectifier, a boosting circuit and a drive control circuit from the application of the reverse voltage.

As shown in the diagram, the rectifier includes: an n-channel power MOSFET S1 including a parasitic diode between the source and drain thereof (hereinafter, referred to as a MOSFET S1); a gate control circuit 51 that acts as a drive control circuit for drive-controlling the MOSFET S1; a boosting circuit 52 for generating a power source voltage for the gate control circuit 51; a power source switching circuit 53; protection circuits 54 to 57 that act as reverse voltage protection circuits; and a power supply control switch S3 that acts as a control switching device for controlling a supplying, as a power source, of an output of the boosting circuit 52 to the gate control circuit 51. External terminals of the rectifier are two terminals that are an anode terminal A and a cathode terminal K. The source electrode and the drain electrode of the MOSFET S1 are connected to the anode terminal A and the cathode terminal K, respectively. Note that, denoted by C1 is a boosting capacitor included in the boosting circuit 52.

Prior to the start of operation of the rectifier, the gate control circuit 51 and the boosting circuit 52 are both in a halt condition, and the MOSFET S1 is in the OFF state. When, in this state, a forward voltage is applied to the rectifier and a current flows from the anode terminal A to the cathode terminal K, a forward current flows through the parasitic diode, whereby a forward voltage of the parasitic diode occurs between the source and drain. This voltage is a positive voltage for which the drain electrode is a reference of potential. This voltage is supplied to the boosting circuit 52 to activate the boosting circuit 52. The boosting circuit 52 boosts the voltage that occurs between the source and drain when the current flows from the anode terminal A to the cathode terminal K. In this case, the boosting circuit 52 boosts the forward voltage of the parasitic diode, and a predetermined voltage is accumulated at the boosting capacitor C1. The voltage of the boosting capacitor C1 is supplied via the power supply control switch S3 to the gate control circuit 51 as a power source voltage (a drive voltage), and the gate control circuit 51 generates a gate drive signal for the MOSFET S1. The gate control circuit 51 detects that the voltage between the source and drain of the MOSFET S1 is a positive voltage for which the drain electrode is a reference of potential. That is, the gate control circuit 51 detects conduction between the source and drain, and generates the gate drive signal so as to drive the gate electrode. Accordingly, the MOSFET S1 is turned on. When the voltage is accumulated at the boosting capacitor C1, the power source switching circuit 53 operates in response thereto. As a result, the voltage of the boosting capacitor C1 is supplied to the boosting circuit 52 as a power source voltage.

When the MOSFET S1 is turned on, a current flows from the anode terminal A to the cathode terminal K through the MOSFET S1. Then, a voltage drop occurs due to the current and the on-resistance of the MOSFET S1, and a voltage occurs between the source and drain. The voltage between the source and drain is a positive voltage for which the drain electrode is a reference of potential. The voltage is inputted to the boosting circuit 52. The boosting circuit 52 performs a boosting operation on the voltage, and the boosted voltage is supplied to both the boosting circuit 52 and the gate control circuit 51 as a power source voltage. Then, the gate control circuit 51 generates a gate drive signal for the MOSFET S1. As a result, the MOSFET S1 is turned on.

By repeating the above operations, the voltage, which occurs between the source and drain when the MOSFET S1 is conductive, is boosted, and the boosted voltage is fed to both the boosting circuit 52 and the gate control circuit 51, whereby the MOSFET S1 is driven continuously.

For example, if, when the MOSFET S1 is in the OFF state, the potential of the cathode terminal K is higher than that of the anode terminal A, i.e., in the case of an inverse characteristic, a current does not flow through the MOSFET S1 since the parasitic diode is present within the MOSFET S1 and a voltage herein is a reverse voltage. Also, the protection circuit 54 blocks the reverse voltage from being applied to the gate control circuit 51, and the protection circuit 56 blocks the reverse voltage from being applied to the boosting circuit 52. Further, the protection circuits 55 and 57 are provided. In this manner, paths, through which a current flows in such a reverse voltage state from the cathode terminal K toward the anode terminal A, can be blocked. Thus, since the protection circuits 54 to 57 for reverse voltage protection are provided, destruction of the boosting circuit 52 and the gate control circuit 51 can be prevented.

As described above, in the present embodiment, the voltage occurring between the source and drain when the MOSFET S1 is conductive is boosted, and the boosted voltage is fed to both the boosting circuit 52 and the gate control circuit 51, whereby the MOSFET S1 is continuously driven. For this reason, it is not necessary to supply, from outside, a drive voltage of, for example, 5V for driving the gate electrode of the MOSFET S1, and the gate control circuit 51 is able to continuously drive-control the MOSFET S1. Thus, since power supply from outside is unnecessary, the rectifier can readily replace a two-terminal diode.

The on-resistance of MOSFETs vary depending on the performance of each MOSFET such as the withstand voltage, shape or the like. In cases of, for example, low on-resistance values, there exist devices whose on-resistance is approximately a few tens of m$\Omega$. Assuming that the on-resistance of the MOSFET S1 is 20 m$\Omega$, when the value of a current flowing from the anode terminal A to the cathode terminal K is, for example, 10 A, the drop voltage is 0.2V. Whereas in general, when a current of 10 A flows through a diode, a forward voltage of an SBD (Schottky Diode) having a low withstand voltage is 0.6 to 1.0V, and a forward voltage of an FRD (Fast Recovery Diode) having a high withstand voltage is 1.0V to 3.0V. As compared to these diodes, the drop voltage of the MOSFET S1 is substantially small, that is, low loss. Therefore, the rectifier according to the present embodiment can readily replace a two-terminal diode. As compared to the diode, conduction loss of the rectifier is reduced, and thus the rectifier is more efficient.

The boosting circuit 52 is activated by a forward voltage that occurs between the source and drain when a forward current flows through the parasitic diode. Thereafter, the power source switching circuit 53 performs switching such that an output from the boosting circuit 52 is used as a power source for the boosting circuit 52. Accordingly, the boosting circuit 52 is able to start operating without power supply from the outside, and efficiently continue to perform stable boosting operations.

Generally speaking, a conventional MOSFET circuit is configured such that the source electrode thereof is used as a reference of potential, and the MOSFET is driven by a drive voltage applied between the source and gate. In the present embodiment, the MOSFET S1 is configured as an n-channel circuit such that the drain electrode thereof is used as a reference of potential, and a positive drive voltage is applied between the drain and gate. Then, a voltage between the source and drain, which is an input voltage of the boosting circuit 52, is a positive voltage for which the drain electrode is a reference of potential, and the positive voltage is boosted to, for example, approximately 5V so as to be used as a positive drive voltage. In this manner, only positive voltages, for which the drain electrode is a reference of potential, are used as input/output voltages of the boosting circuit 52. The gate control circuit 51 directly uses the boosted voltage as a power source voltage (a drive voltage). For this reason, the boosting circuit 52 and the gate control circuit 51 can be readily configured, and this realizes a small-sized and simplified configuration of the rectifier.

Note that, the gate control circuit 51 performs control so as to cause the MOSFET S1 to continuously perform an ON operation. The value of the drop voltage between the source and drain when the MOSFET S1 is ON is small in the first place. For this reason, the drive voltage, for which the drain electrode is a reference of potential, can be used as a voltage that is at substantially the same level as a voltage for which the source electrode is a reference of potential.

Fifth Embodiment

Described below are specific circuit components of the rectifier according to the above fourth embodiment. FIG. 9 shows a circuit configuration of the rectifier, according to the fifth embodiment of the present invention.

As shown in FIG. 9, a comparator 61 is used as the gate control circuit 51 of FIG. 8, and the boosting circuit 52 is formed with a boost converter 62, a boosting coil L1, the boosting capacitor C1, a boosting switch S2 and a boosting diode D1. The power source switching circuit 53 is formed with a power source switching diode D2 and a power source switching resistor R2. Further, a reverse voltage protection device DZ1 and a reverse current prevention device DS3 are provided as control circuit protection devices to be included in the protection circuit 54. Also, boosting circuit protection devices DZ2 and D3 are provided as reverse voltage protection devices to be included in the protection circuit 56. Further, a reverse current prevention device DS1 is provided as a reverse current prevention device to be included in the protection circuit 55, and a reverse current prevention switch DS2 is provided as a reverse current prevention device to be included in a protection circuit 57. Still further, the power supply control switch S3 is provided as a semiconductor switching device for controlling power supply to the comparator 61. Note that, denoted by R1 is a voltage detection resistor; denoted by R3 is an erroneous operation prevention resistor for preventing erroneous operations of the MOSFET S1; and denoted by R4 and R5 are control resistors of the power supply control switch S3.

Hereinafter, operations performed by the rectifier will be described in detail.

Prior to the start of operation of the rectifier, the comparator 61 and the boost converter 62 are both in a halt condition, and the MOSFET S1 is in the OFF state. When, in this state, a current flows from the anode terminal A to the cathode terminal K, a forward current flows through the parasitic diode of the MOSFET S1, whereby a forward voltage of the parasitic diode occurs between the source and drain. This voltage is a positive voltage for which the drain electrode is a reference of potential and which is supplied to the boost converter 62.

Here, a difference voltage between the forward voltage of the parasitic diode of the MOSFET S1 and a forward voltage of the reverse current prevention device DS1 is set to be equal to or higher than a voltage that activates the boost converter 62, and the difference voltage activates the boost converter 62. In other words, the forward voltage of the parasitic diode of the MOSFET S1 is required to be greater than the forward voltage of the reverse current prevention device DS1. Here, as for currents flowing through these diodes, the former current is substantially greater than the latter, and as shown in FIG. 5 previously referred to, a forward voltage of a diode, i.e., a voltage that occurs when a current is applied, increases in accordance with an increase in the applied current. Therefore, there is no particular difficulty satisfying the above requirement.

When the boost converter 62 is activated, oscillation occurs whereby the boosting switch S2 is driven to start a boosting operation, and voltage is accumulated at the boosting capacitor C1. The reverse current prevention switch DS2 is controlled based on a drive signal of the comparator 61. A forward voltage of a parasitic diode (parallel diode) of the reverse current prevention switch DS2 is set to be lower than the forward voltage of the parasitic diode of the MOSFET S1. There is also no difficulty satisfying such setting for the same reason as that described above in relation to the forward voltage of the reverse current prevention device DS1.

Although the reverse current prevention switch DS2 is OFF when the boost converter 62 is activated, a positive voltage is inputted to the boosting coil L1 through the parasitic diode.

Although the MOSFET S1 and the reverse current prevention switch DS2 are both controlled based on the drive signal of the comparator 61, a MOSFET alone having the same or higher performance than the MOSFET S1, or such a MOSFET and a diode which are in parallel to each other, are disposed as the reverse current prevention switch DS2, and the reverse current prevention switch DS2 performs an ON operation as fast as, or faster than, the MOSFET S1. Accordingly, a drop voltage at a boosting path of the boosting circuit can be reduced. At the ON operation of the MOSFET S1 as well as after the MOSFET S1 is turned on, a positive voltage is inputted to the boosting coil L1, whereby a boosting operation is enabled.

When activated, the boost converter 62 boosts a voltage that is inputted to the boosting coil L1 through the forward voltage of the parasitic diode of the MOSFET S1 (the difference voltage between the forward voltage of the parasitic diode of the MOSFET S1 and the forward voltage of the parasitic diode of the reverse current prevention switch DS2). Accordingly, a predetermined voltage of, for example, 5V is accumulated at the boosting capacitor C1. When the predetermined voltage is accumulated at the boosting capacitor C1, the power supply control switch S3 is turned on, and the voltage of 5V is supplied to the comparator 61 as a power source voltage (a drive voltage). The comparator 61 detects that a voltage between the source and drain of the MOSFET 51 is a positive voltage for which the drain electrode is a reference of potential, i.e., the comparator 61 detects conduction between the source and drain. Then, the comparator 61 applies, to the gate electrode, a Hi signal that is a gate drive signal, thereby turning on the MOSFET S1.

In order to turn on a MOSFET, it is usually necessary to apply a predetermined voltage between the source and gate. As for a general MOSFET, the value of the voltage is 2 to 4V. Accordingly, outputting the Hi signal, which is the same as the power source voltage of 5V, between the drain and gate of the MOSFET S1 is sufficient for the comparator 61 to turn on the MOSFET S1.

When the voltage is accumulated at the boosting capacitor C1, the voltage of the boosting capacitor C1 is supplied, using the power source switching diode D2 and the power source switching resistor R2, to the boost converter 62 as a power source voltage. For this reason, a potential difference between the source and drain decreases after the MOSFET S1 is turned on. As a result, even if the voltage inputted to the boost converter 62 through the reverse current prevention device DS1 is decreased, a boosting operation can be stably performed by using the power source voltage that is provided via the power source switching diode D2 and the power source switching resistor R2. As a result of this operation, the power source voltage is also stably supplied to the comparator 61.

When the MOSFET S1 is turned on, a current flows from the anode terminal A to the cathode terminal K through the MOSFET S1. Then, a voltage drop occurs due to the current and the on-resistance of the MOSFET S1, and a voltage occurs between the source and drain. The voltage between the source and drain is a positive voltage for which the drain electrode is a reference of potential. As described above, the positive voltage is inputted to the boosting coil L1, and the boost converter 62 drives the boosting switch S2 to accumulate voltage at the boosting capacitor C1.

As described above, the voltage accumulated at the boosting capacitor C1 is supplied to both the boost converter 62 and the comparator 61 as a power source voltage. Then, the comparator 61 generates the gate drive signal for the MOSFET S1, and the MOSFET S1 is turned on, accordingly.

By repeating the above operations, the voltage, which occurs between the source and drain when the MOSFET S1 is conductive, is boosted, and the boosted voltage is fed to both the boost converter and the comparator 61, whereby the MOSFET S1 is driven continuously.

For example, if, when the MOSFET S1 is in the OFF state, the potential of the cathode terminal K is higher than that of the anode terminal A, i.e., in the case of an inverse characteristic, a reverse voltage is applied to the parasitic diode of the MOSFET 1, and a current does not flow through the MOSFET S1. Further, the control circuit protection device DZ1 blocks a reverse voltage to the input voltage of the comparator 61. The boosting circuit protection device DZ2 blocks a reverse voltage from being applied to the boost converter 62. Also, the boosting circuit protection device D3 blocks a reverse voltage from being applied to the boosting switch S2. A path, through which a current flows in such a reverse voltage state from the cathode terminal K toward the anode terminal A via the control circuit protection device DZ1, can be blocked by the reverse current prevention device DS3. Also, a path, through which a current flows in the reverse voltage state from the cathode terminal K toward the anode terminal A via the boosting circuit protection device DZ2, can be blocked by the reverse current prevention device DS1. Further, when the MOSFET S1 is OFF, the reverse current prevention switch DS2 is also OFF, and a path, through which a current flows in the reverse voltage state from the cathode terminal K toward the anode terminal A via the boosting circuit protection device D3, can be blocked by the reverse current prevention switch DS2.

The power supply control switch S3 is turned off if the voltage of the boosting capacitor C1 decreases at a timing of switching from the positive characteristic to the inverse characteristic in which the potential of the cathode terminal K is higher than that of the anode terminal A. Accordingly, the power supply to the comparator 61 is cut off. In this manner, the drive control of the MOSFET S1 by the comparator 61 is completely ceased during such an inverse characteristic period, without causing the MOSFET S1 to be turned on due to a control delay or erroneous operation. This assuredly prevents a current from flowing in the reverse voltage state from the cathode terminal K to the anode terminal A.

In this case, a p-channel MOSFET is used as the power supply control switch S3, and the resistors R4 and R5 are used for ON/OFF control. However, the same effects can be obtained by using ICs for the ON/OFF control, instead.

Although using the comparator 61 as the gate control circuit 51 has been described, the same control can still be performed by using an operational amplifier. By using non-inverting buffer ICs or the like for these components, the gate drive capability thereof is improved. In this case, such control as to cause the reverse current prevention switch DS2 to perform an ON operation at an earlier timing than the MOSFET S1, can be performed. Further, the MOSFET S1 can be formed with multiple MOSFETs.

Although the boost converter 62 is used as the boosting circuit 52, a different boosting circuit such as a charge pump or the like may be applied to obtain the same effects.

Further, in the forgoing fourth and fifth embodiments, the above-described reverse voltage protection circuits are provided in order to protect, when a reverse voltage is applied between the two terminals, i.e., the A and K terminals, of the rectifier, the boosting circuit and the drive control circuit from the application of the reverse voltage. However, the necessity of additionally providing the reverse voltage protection circuits is eliminated when the boosting circuit and the drive control circuit have necessary voltage-withstanding characteristics.

INDUSTRIAL APPLICABILITY

As described above, the rectifier according to the present invention does not require power supply from outside and can stably continue to perform operations in the ON state. For this reason, the rectifier can readily replace a two-terminal diode. As compared to the diode, conduction loss of the rectifier is reduced, and thus the rectifier improves efficiency. Therefore, the present invention is expected to provide substantial advantages by being applied to a wide range of electrical equipments including diodes.

The invention claimed is:
1. A rectifier, external terminals of which are two terminals that are an anode terminal and a cathode terminal, the rectifier comprising:
 a semiconductor switching device connected between the two terminals, which is drive-controlled via a gate electrode thereof;
 a parallel diode, connected in parallel to the semiconductor switching device, for performing a rectifying operation when the rectifier starts operating; and
 a drive signal generator configured to output a drive signal to the gate electrode of the semiconductor switching device, the drive signal generator using, as a power source, a forward voltage that occurs between the two terminals when a voltage is applied across the anode and cathode terminals so that the two terminals are conductive with each other, whereby the semiconductor switching device is driven in an ON state for a duration of the forward voltage, and the drive signal generator includes:
 a boosting circuit configured to boost the forward voltage, which occurs between the two terminals when the two terminals are conductive with each other, to a predeter- mined voltage, and the boosting circuit is formed with a preceding-stage boosting section and a subsequent-stage boosting section, and a drive control circuit configured to output the drive signal to the gate electrode of the semiconductor switching device, the drive control circuit using an output of the boosting circuit as a power source, wherein the subsequent-stage boosting section is activated by a voltage boosted by the preceding-stage boosting section, and boosts the forward voltage, which occurs between the two terminals, to the predetermined voltage and outputs the predetermined voltage, and uses the outputted predetermined voltage as a power source voltage for causing the subsequent-stage boosting section to operate.

2. The rectifier according to claim 1, wherein the drive control circuit outputs the drive signal in accordance with the forward voltage occurring between the two terminals.

3. The rectifier according to claim 1, wherein,
the boosting circuit uses the output thereof as a power source voltage for causing the boosting circuit to operate, and
at a start of operation of the boosting circuit, the boosting circuit operates based on the forward voltage occurring between both ends of the parallel diode.

4. The rectifier according to claim 1, wherein,
the preceding-stage boosting section includes a charge pump, and
the subsequent-stage boosting section includes a DC/DC converter.

5. The rectifier according to claim 3, wherein the boosting circuit includes a power source switching circuit for switching a power source connection of the boosting circuit, such that the boosting circuit, at the start of operation thereof, operates based on the forward voltage occurring between the two terminals, and, after having started the operation, uses an output voltage of the boosting circuit as a power source for the boosting circuit.

6. The rectifier according to claim 5, wherein,
the boosting circuit includes a capacitor for accumulating a boosted voltage, and
the power source switching circuit performs switching such that the boosting circuit, at the start of operation thereof, operates based on the forward voltage occurring between the two terminals, and, after having started the operation, uses the voltage of the capacitor as the power source for the boosting circuit.

7. The rectifier according to claim 1, wherein,
the semiconductor switching device is a power MOSFET including a parasitic diode between a source and a drain thereof, and
the parasitic diode is the parallel diode.

8. The rectifier according to claim 7, wherein,
the power MOSFET is an n-channel MOSFET, a drain electrode of which is connected to the cathode terminal and a source electrode of which is connected to the anode terminal, and
the boosting circuit uses, as an input/output voltage thereof, a positive voltage for which the drain electrode of the MOSFET is a reference of potential, and the MOSFET operates in accordance with the drive signal that is based on the positive voltage for which the drain electrode is a reference of potential.

9. The rectifier according to claim 1, further comprising:
a reverse voltage protection circuit configured to protect, when a reverse voltage is applied between the two terminals, the boosting circuit and the drive control circuit from application of the reverse voltage.

10. The rectifier according to claim 9, wherein the reverse voltage protection circuit comprises:
a reverse voltage protection device configured to prevent the reverse voltage from being applied; and
a reverse current prevention device configured to prevent a reverse current from flowing from the cathode terminal to the anode terminal through the reverse voltage protection device.

11. The rectifier according to claim 10, wherein a switching device, which is controlled based on the drive signal outputted from the drive control circuit, is used as the reverse current prevention device.

12. The rectifier according to claim 1, further comprising:
a control switching device configured to control a supplying, as a power source, of an output of the boosting circuit to the drive control circuit, wherein
when a reverse voltage is applied between the two terminals, the control switching device is turned off and thereby the semiconductor switching device is turned off, whereby a reverse current is prevented from flowing from the cathode terminal to the anode terminal through the semiconductor switching device.

* * * * *